(12) United States Patent
Fujita et al.

(10) Patent No.: US 7,687,831 B2
(45) Date of Patent: Mar. 30, 2010

(54) SOLID STATE IMAGE PICKUP DEVICE

(75) Inventors: Hiroaki Fujita, Kanagawa (JP); Ryoji Suzuki, Kanagawa (JP); Nobuo Nakamura, Kanagawa (JP); Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 645 days.

(21) Appl. No.: 10/382,058

(22) Filed: Mar. 5, 2003

(65) Prior Publication Data
US 2003/0209712 A1 Nov. 13, 2003

(30) Foreign Application Priority Data
Mar. 6, 2002 (JP) .............................. 2002-059989

(51) Int. Cl.
H01L 27/148 (2006.01)
H01L 31/113 (2006.01)
H01L 31/00 (2006.01)
H01L 31/06 (2006.01)

(52) U.S. Cl. ...................... 257/222; 257/229; 257/291; 257/443; 257/465

(58) Field of Classification Search ................. 257/222, 257/223, 229, 291, 292, 443, 446, 461–465
See application file for complete search history.

(56) References Cited

U.S. PATENT DOCUMENTS 5,514,887 A * 5/1996 Hokari ....................... 257/222
6,114,740 A * 9/2000 Takimoto et al. ............ 257/461
6,136,629 A * 10/2000 Sin ............................... 438/48
6,423,993 B1 * 7/2002 Suzuki et al. ............... 257/292
6,548,833 B1 * 4/2003 Lin et al. ...................... 257/89
6,580,109 B1 * 6/2003 Thomas et al. ............. 257/292
2001/0006237 A1 * 7/2001 Abe ............................ 257/215
2003/0143744 A1 * 7/2003 Takahashi et al. ............ 438/69

FOREIGN PATENT DOCUMENTS

JP 9-232556 * 9/1997
JP 2000-299453 * 10/2000

* cited by examiner

*Primary Examiner*—Wael Fahmy
*Assistant Examiner*—Shrininvas H. Rao
(74) *Attorney, Agent, or Firm*—Robert J. Depke; Rockey, Depke & Lyons, LLC

(57) ABSTRACT

P type semiconductor well regions 8 and 9 for device separation are provided in an upper and lower two layer structure in conformity with the position of a high sensitivity type photodiode PD, and the first P type semiconductor well region 8 at the upper layer is provided in the state of being closer to the pixel side than an end portion of a LOCOS layer 1A, for limiting a dark current generated at the end portion of the LOCOS layer 1A. In addition, the second P type semiconductor well region 9 at the lower layer is formed in a narrow region receding from the photodiode PD, so that the depletion layer of the photodiode PD is prevented from being obstructed, and the depletion is secured in a sufficiently broad region, whereby enhancement of the sensitivity of the photodiode PD can be achieved.

15 Claims, 2 Drawing Sheets

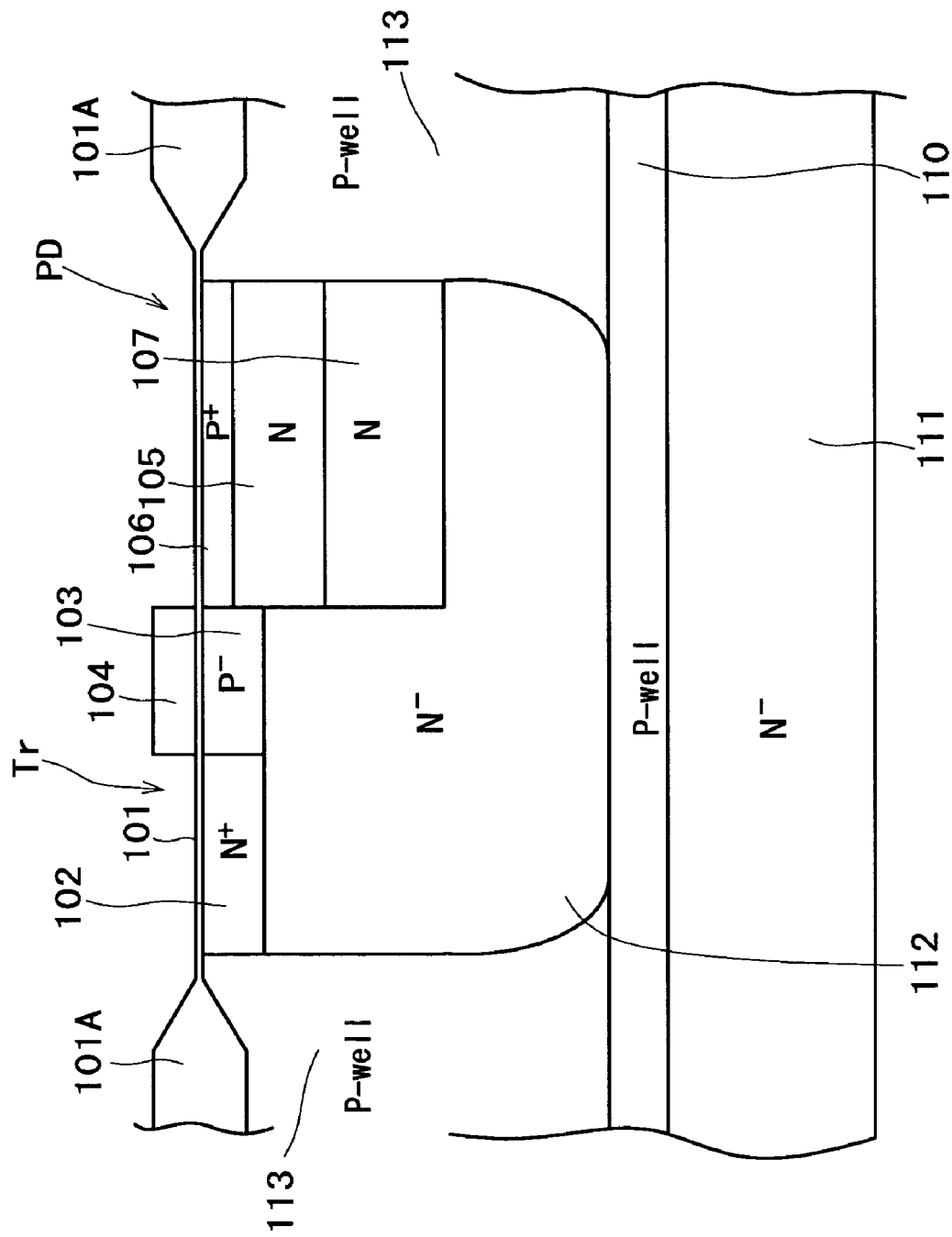

ary embodiment of the invention is characterized in
SOLID STATE IMAGE PICKUP DEVICE This application claims priority to Japanese Patent Application Number JP2002-059989 filed Mar. 6, 2002, which is incorporated herein by reference.

The present invention relates to a solid state image pickup device comprising a photo-electric conversion device for generating a signal charge according to the amount of light received, and a pixel transistor for reading out the signal charge generated by the photo-electric conversion device, in each of a plurality of pixels arranged in a semiconductor chip.

RELATED ART

In recent years, video cameras and electronic cameras have become very popular, and CCD type and MOS type solid state image pickup devices have been primarily used in these cameras.

Among these devices, the MOS type solid state image pickup device has a structure in which a plurality of pixels comprising photo-electric conversion devices (photodiodes; PD) respectively are arranged in a two-dimensional array to form an image pickup region. A floating diffusion (FD) portion and various other MOS transistors for transfer, amplification and the like are also provided in each pixel. The light incident on each unit pixel is subjected to photo-electric conversion by the photodiode to generate a signal charge. The signal charge is transferred to the FD portion by the transfer transistor and a potential variation in the FD portion is detected by the amplification transistor. The detected potential variation is converted into an electrical signal and is amplified, whereby a signal from each pixel is outputted through a signal conductor.

In such MOS type solid state image pickup devices, there is known one in which a plurality of layers of N type well regions are formed by injection of ions at different energy or by the injection of different species of ions, on the lower side of an N type well region constituting a charge accumulation region of the photo-electric conversion device, whereby a depletion layer is elongated in the depth direction so as to provide enhanced sensitivity.

In this case, a P type well region that forms a barrier for device separation and for preventing mixing of signal charges (mixing of colors) between the adjacent pixels must also be formed in a deep region in conformity with the N type well region of the photo-electric conversion device.

FIG. 2 is a sectional view showing the pixel structure of such an MOS type solid state image pickup device for achieving increased sensitivity.

The MOS type solid state image pickup device has a structure in which a P type semiconductor well region 110 is provided on an N type semiconductor region 111, and a photodiode PD and a pixel transistor Tr are provided in an N type semiconductor region 112. These layers are formed on the upper side of the P type semiconductor well region 110.

The photodiode PD includes a P type semiconductor region 106 provided as a positive hole accumulation layer at an uppermost layer of the N type semiconductor region 112. An N type electric charge accumulation region 105 is formed as a layer on the lower side of the P type semiconductor region 106. Additionally, an N type semiconductor region 107 is provided as a layer on the lower side of the N type electric charge accumulation region 105, whereby a depletion layer is elongated in the depth direction so as to provide enhanced sensitivity.

In addition, a P type semiconductor region 103 to be a channel of a transfer transistor Tr is formed adjacent to the photodiode PD, and an N type drain region 102 of the transfer transistor Tr is provided adjacent to the P type semiconductor region 103. This N type drain region 102 is the above-mentioned FD portion.

A gate electrode 104 consisting of a polysilicon film is provided on the upper side of the P type semiconductor region 103 with an insulating film (gate oxide film) 101 consisting of a silicon oxide film located therebetween. When a predetermined voltage is applied to the gate electrode 104, a signal charge accumulated in the photodiode PD is transferred into the N type drain region 102.

Incidentally, although other transistors are also provided in the pixel, the remaining transistors have no direct relation with the characteristic features of the present invention, so that description of these transistors has been omitted. The omitted operational characteristics are well known to those of ordinary skill in the art.

Additionally, for conventionally forming adjacent pixels, an insulating layer 101A for device separation constituted of LOCOS is provided in an upper portion of a silicon substrate at a boundary portion of the pixel. A P type semiconductor well region 113 as a channel stop region is provided as a layer on the lower side of the insulating layer 101A.

The P type semiconductor well region 113 is formed such that it is nearer to the pixel side than an end portion of the LOCOS layer 101A, for reducing a dark current generated at the end portion of the LOCOS layer 101A. This structure is formed to such a deep position as to reach the P type semiconductor well region 110 at the lower layer, consistent with the position of the high sensitivity type photodiode PD as above-mentioned.

However, in the case where the P type well region for device separation is formed deeply as above-mentioned, the amount of diffusion of ion species in the horizontal direction increases as the ion injection for the formation is conducted at higher energy.

Therefore, as shown in FIG. 2, the P type well region at a deep layer portion spreads to the side of the high sensitivity type photodiode PD. This thereby narrows the depletion region, whereby the sensitivity-enhancing effect is reduced, or shading characteristics are worsened.

In view of the foregoing, it is one object of the present invention to provide a solid state image pickup device in which it is possible to prevent a depletion layer of a high sensitivity type photo-electric conversion device from being obstructed by a well region that is used for device separation. The well region for device separation is formed deeply in the semiconductor substrate in conformity with the high sensitivity type photo-electric conversion device, and it is also possible to realize an effective enhancement of sensitivity and an improvement of shading.

Other objects and advantages of the present invention will be apparent in light of the following summary and detailed description.

SUMMARY OF THE INVENTION

In order to attain the above objects and advantages, an exemplary embodiment of the invention is characterized in that, a solid state image pickup device is comprised of a photo-electric conversion device for generating a signal charge according to the amount of light received, and at least one pixel transistor for reading out the signal charge generated by the photo-electric conversion device. A plurality of pixels are preferably arranged in a semiconductor substrate. In the preferred exemplary embodiment, well regions for device separation are provided at boundary portions between adjacent ones of the plurality of pixels. The well regions for device separation are each comprised of a plurality of layers of well regions in the depth direction of the semiconductor substrate, and the plurality of layers of well regions are so formed that the lower-layer well region is formed in a narrow region receding farther from each pixel than the upper-layer well region.

In the solid state image pickup device according to the present invention, the well regions for device separation are each comprised of a plurality of layers of well regions in the depth direction of the semiconductor substrate, and the lower-layer well region of the plurality of layers is formed in a narrow region receding farther from each pixel than the upper-layer well region. Therefore, in a constitution in which the well regions for device separation are formed deeply in the semiconductor substrate in conformity with the high sensitivity type photo-electric conversion device, it is possible to prevent a depletion layer of the high sensitivity type photo-electric conversion device from being obstructed by the well regions for device separation, and it is possible to achieve an effective enhancement of sensitivity and a shading-restraining effect.

BRIEF DESCRIPTION OF THE DRAWINGS

FIG. 2 is a sectional view showing the pixel constitution of a MOS type solid state image pickup device according to a related art.

DETAILED DESCRIPTION OF THE PREFERRED EMBODIMENT

Figure 1:
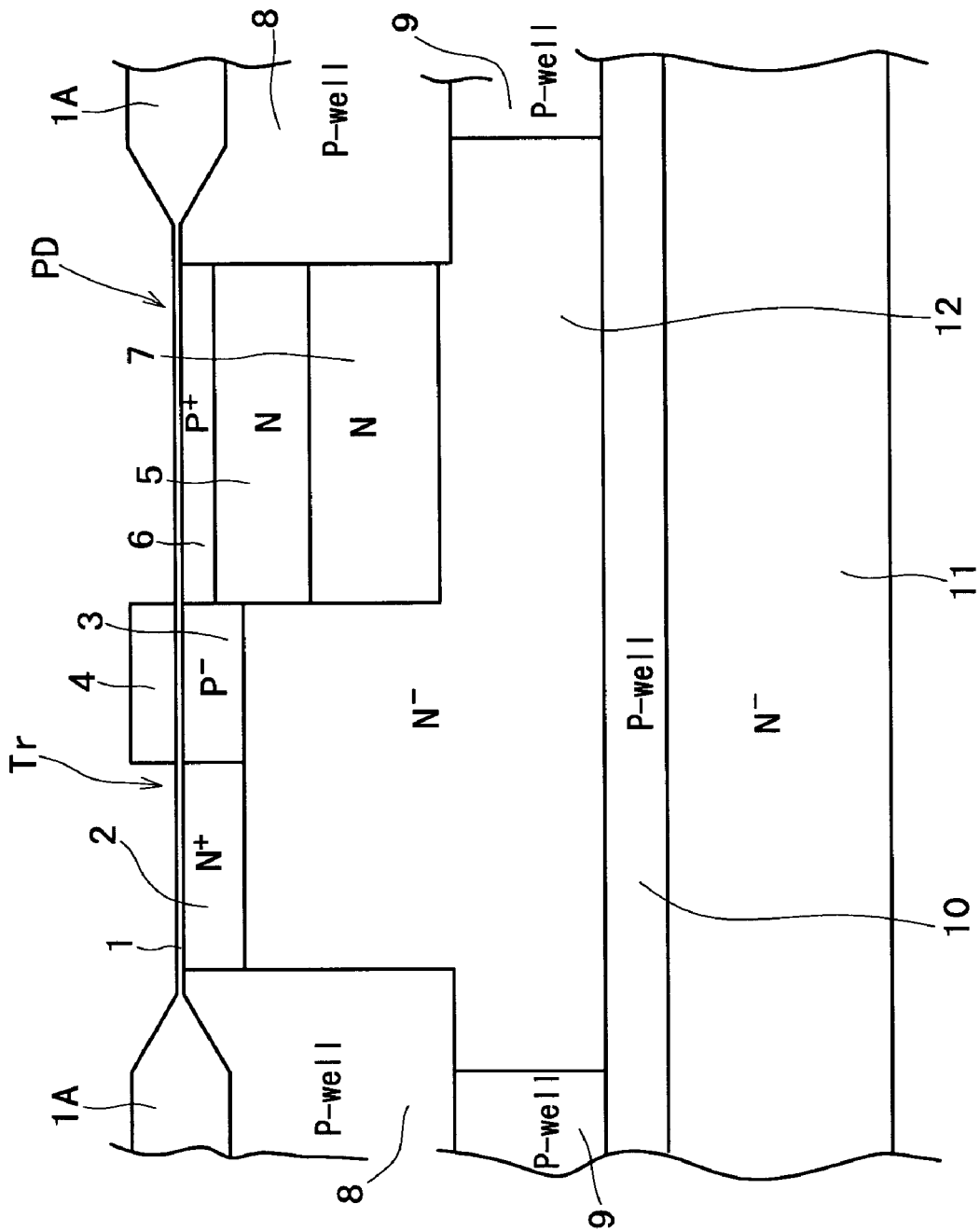
FIG. 1 is a sectional view showing the pixel constitution of a MOS type solid state image pickup device according to an exemplary embodiment of the present invention.

FIG. 1 is a cross-sectional view that illustrates the pixel constitution of a MOS type solid state image pickup device according to the preferred exemplary embodiment.

The solid state image pickup device preferably has a structure in which a P type semiconductor well region 10 is provided on an N type semiconductor region 11, and a photodiode PD and a pixel transistor Tr are provided in an N type semiconductor region 12 at the upper side of the P type semiconductor well region 10 as shown.

The photodiode PD includes a P type semiconductor region 6 as a positive hole accumulation layer at an uppermost level above the N type semiconductor region 12, and an N type electric charge accumulation region 5 as a layer on the lower side of the P type semiconductor region 6. An N type semiconductor region 7 is provided as a layer on the lower side of the N type electric charge accumulation region 5, whereby a depletion layer is elongated in the depth direction so as to provide enhanced sensitivity.

In addition, a P type semiconductor region 3 forming a channel of a transfer transistor Tr is provided adjacent to such the photodiode PD, and an N type drain region 2 of the transfer transistor Tr is provided adjacent to the P type semiconductor region 3. The N type drain region 2 is the above-mentioned FD portion.

A gate electrode 4 consisting of a polysilicon film is provided on the upper side of the P type semiconductor region 3 with an insulating film (gate oxide film) 1 consisting of a silicon oxide film formed therebetween. When a predetermined voltage is applied to the gate electrode 4, a signal charge accumulated in the photodiode PD is transferred into the N type drain region 2.

It will be recognized that other transistors are also provided in the pixel, but these transistors have no direct relation with the characteristic features of the present invention, so that description of these transistors has been omitted. In addition, various wiring layers, upper-layer insulating films, and, further, an on-chip color filter, an on-chip micro-lens and the like are appropriately disposed in layers on the upper side of the gate electrode 4. However, these components have no direct relation with the characteristic features of the present invention, so that description of these components is omitted.

An insulating layer 1A for device separation constituted of LOCOS is provided at an upper portion of the silicon substrate, at a boundary portion of the pixel. Upper and lower layers of P type semiconductor well regions 8 and 9 are provided as channel stop regions as layers on the lower side of the insulating layer 1A.

The P type semiconductor well regions 8 and 9 are the well regions for device separation which constitute a characteristic feature of the present invention. In accordance with the preferred exemplary embodiment, the first P type semiconductor well region 8 is provided beneath the LOCOS layer 1A, and the second P type semiconductor well region 9 is provided as a layer on the lower side of the first P type semiconductor well region 8.

A lower end portion of the second P type semiconductor well region 9 preferably extends to the P type semiconductor well region 10, and constitutes a barrier in the structure of surrounding the depletion layer of the photodiode PD from lateral sides and the lower level.

The well regions 8 and 9 are formed as upper and lower layers by the injection of ions at different injection energy or the injection of different species of ions so that the P type semiconductor well region is formed down to such a deep position as to reach the P type semiconductor well region 10 at the lower layer, as described above.

The first P type semiconductor well region 8 at the upper layer is provided such that it is nearer to the pixel than an end portion of the LOCOS layer 1A, for limiting a dark current generated at the end portion of the LOCOS layer 1A.

In addition, because the second P type semiconductor well region 9 at the lower layer is formed by injection of ions at high energy, the amount of diffusion of the impurity in lateral directions is large there.

In view of this characteristic, in order not to narrow the depletion layer which determines the range of collection of signal charges in the photodiode PD, the pattern of the second P type semiconductor well region 9 is formed in a narrow region receding farther away from the photodiode PD than the pattern of the first P type semiconductor well region 8 (namely, in the condition of being away from the N type electric charge accumulation region 5).

As a result, the depletion layer of the photodiode PD is prevented from being obstructed by the second P type semiconductor well region 9 formed at a deep position, and the depletion layer is secured in a sufficiently broad region, whereby enhancement of the sensitivity of the photodiode PD can be realized.

In addition, by adopting such a structure, the depletion layer is broadened in the horizontal directions, so that quantum efficiency for skew light can be enhanced, and shading characteristics can be improved.

While the preferred exemplary embodiment of the present invention has been described above, the present invention is not limited to the preferred exemplary embodiment, and various modifications can be made.

For example, while in the preferred exemplary embodiment the upper and lower two layers of P type semiconductor well regions 8 and 9 are provided as described above, in an alternate embodiment, a design in which three or more layers of P type semiconductor well regions are provided may be adopted.

In addition, as the constitution of transistors in the pixel, it may generally be considered to provide, for example, a transfer transistor for transferring the signal charge generated in the photodiode PD to an FD portion, an amplification transistor for converting the potential variation in the FD portion into an electrical signal, a reset transistor for resetting the potential of the FD portion, a selection transistor for selecting an output of the amplification transistor, and the like. A variety of alternate designs, ranging from one in which the pixel is comprised of one transistor to a construction in which the pixel is comprised of not less than five transistors, have been proposed, and some of them have been put to practical use. The present invention is to be construed as being applicable to any of these systems. The list of alternate structures described above is not exhaustive and those skilled in the art will appreciate that other modifications may also be made which nonetheless fall within the scale of the claims.

As has been described above, a solid state image pickup device according to the present invention, the well regions for device separation are each comprised of a plurality of layers of well regions in the depth direction of the semiconductor substrate, and the lower-layer well region of the plurality of layers is formed in a narrow region receding farther from each pixel than the upper-layer well region. Therefore, in a constitution in which the well region for device separation is formed deeply in the semiconductor substrate in conformity with a high sensitivity type photo-electric conversion device, the depletion layer of the high sensitivity type photo-electric conversion device can be prevented from being obstructed by the well region for device separation. Consequently, an effective enhancement of sensitivity can be realized, and shading characteristics can be improved.

What is claimed is:

1. A solid state image pickup device comprising:
   a first conductivity type semiconductor body;
   a second conductivity type well region formed in the semiconductor body;
   a plurality of pixels, each pixel comprising a photo-electric conversion element and one or more pixel transistors formed above said second conductivity type well region; and
   a second conductivity type well region for device separation is provided between said pixels;
   wherein said photo-electric conversion element is comprised of a plurality of regions of the first conductivity type formed in the depth direction; and
   wherein said second conductivity type well region for device separation is comprised of a plurality of well regions formed in the depth direction such that a lower well region is smaller than an upper well region.

2. The solid state image pickup device as set forth in claim 1, wherein a device separation insulating layer for separating adjacent pixels is provided at an upper portion of said device, and said well region for device separation is provided below said device separation insulating layer.

3. The solid state image pickup device as set forth in claim 2, wherein the upper well region of said plural layers of well regions is located nearer to flue photo-electric conversion element than an end portion of said device separation insulating layer.

4. The solid state image pickup device as set forth in claim 1, wherein said plural well regions constituting said well region for device separation are formed by injection of an ion at different injection energy or by injection of a different species of ions.

5. The solid state image pickup device as set forth in claim 1, wherein said photo-electric conversion element is comprised of a P type semiconductor region located at an upper portion of said semiconductor, and said N type regions are located below said P type semiconductor region.

6. The solid state image pickup device as set forth in claim 1, wherein the second conductivity type well region is a P type semiconductor well region formed in an N type silicon substrate, said plurality of pixels are located above said P type semiconductor well region, and said well region for device separation is a P type semiconductor well region.

7. The solid state image pickup device as set forth in claim 1, further comprising a floating diffusion for taking out signal charge generated by said photo-electric conversion element, and a transfer transistor for transferring said signal charge generated by said photo-electric conversion element to said floating diffusion portion.

8. The solid state image pickup device as set forth in claim 7, further comprising an amplification transistor for converting a potential variation in said floating diffusion portion into an electric signal.

9. The solid state image pickup device as set forth in claim 8, further comprising a reset transistor for resetting the potential of said floating diffusion portion.

10. The solid state image pickup device as set forth in claim 9, which further comprises a selection transistor for selecting an output of said amplification transistor.

11. The solid state image pickup device as set forth in claim 1, wherein said plurality of well regions forming said well region for device separation are formed contiguously in the depth direction.

12. The solid state image pickup device as set forth in claim 2, wherein said plurality of well regions forming said well region for device separation are formed contiguously in the depth direction from the device separation insulating layer to the second conductivity type well region.

13. The solid state image pickup device as set forth in claim 11, wherein the well region for device separation immediately adjacent the second conductivity type well region is the smallest of the plurality of well regions, and the well region for device separation immediately adjacent the device separation insulating layer is the largest of the plurality of well regions.

14. The solid state image pickup device as set forth in claim 11, wherein the well region for device separation immediately adjacent the second conductivity type well region is also immediately adjacent a lowest region of the plurality regions comprising the photo-electric conversion element.

15. The solid state image pickup device as set forth in claim 11, wherein the well region for device separation immediately adjacent the second conductivity type well region that is also immediately adjacent the lowest region of the plurality of regions comprising the photo-electric conversion element is not immediately adjacent any one of the remaining regions comprising the photo-electric conversion element.

* * * * *